US010600606B2

(12) United States Patent
Ok et al.

(10) Patent No.: US 10,600,606 B2
(45) Date of Patent: Mar. 24, 2020

(54) VERTICAL VACUUM CHANNEL TRANSISTOR WITH MINIMIZED AIR GAP BETWEEN TIP AND GATE

(71) Applicant: INTERNATIONAL BUSINESS MACHINES CORPORATION, Armonk, NY (US)

(72) Inventors: Injo Ok, Loudonville, NY (US); Choonghyun Lee, Rensselaer, NY (US); Soon-Cheon Seo, Glenmont, NY (US); Seyoung Kim, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/391,629

(22) Filed: Apr. 23, 2019

(65) Prior Publication Data

US 2019/0378675 A1 Dec. 12, 2019

Related U.S. Application Data

(62) Division of application No. 16/005,204, filed on Jun. 11, 2018, now Pat. No. 10,347,456.

(51) Int. Cl.
*H01L 21/00* (2006.01)
*H01J 21/10* (2006.01)
(Continued)

(52) U.S. Cl.
CPC .............. *H01J 21/105* (2013.01); *H01J 9/18* (2013.01); *H01J 19/24* (2013.01);
(Continued)

(58) Field of Classification Search
CPC .......... H01L 29/6666; H01L 27/11556; H01L 29/78642; H01L 29/7889
See application file for complete search history.

(56) References Cited

U.S. PATENT DOCUMENTS 5,012,153 A * 4/1991 Atkinson ................ H01J 3/022
313/309
6,437,360 B1 8/2002 Cho et al.
(Continued)

OTHER PUBLICATIONS

List of IBM Patents or Patent Applications Treated as Related dated Apr. 23, 2019, 2 pages.
(Continued)

*Primary Examiner* — Nicholas J Tobergte
(74) *Attorney, Agent, or Firm* — Tutunjian & Bitetto, P.C.; Vazken Alexanian

(57) ABSTRACT

A method is presented for controlling an electric field from a gate structure. The method includes forming a hardmask over a fin stack including a plurality of layers, forming a first dielectric layer over the hardmask, forming a sacrificial layer over the first dielectric layer, etching the sacrificial layer to expose a top surface of the first dielectric layer, depositing a second dielectric layer in direct contact with exposed surfaces of the first dielectric layer and the sacrificial layer, removing a layer of the plurality of layers of the fin stack to define an air gap within the fin stack, and forming triangle-shaped epitaxial growths within the air gap defined within the fin stack.

20 Claims, 11 Drawing Sheets

(51) Int. Cl.
*H01J 9/18* (2006.01)
*H01J 19/24* (2006.01)
*H01L 29/788* (2006.01)
*H01L 27/11556* (2017.01)
*H01L 29/66* (2006.01)
*H01L 21/02* (2006.01)
*H01L 29/78* (2006.01)
*H01L 29/786* (2006.01)

(52) U.S. Cl.
CPC .... *H01L 29/7889* (2013.01); *H01L 21/02532* (2013.01); *H01L 27/11556* (2013.01); *H01L 29/66666* (2013.01); *H01L 29/7827* (2013.01); *H01L 29/78642* (2013.01)

(56) References Cited

U.S. PATENT DOCUMENTS

| | | | |
|---|---|---|---|
| 9,006,066 B2 | 4/2015 | Chi et al. | |
| 9,299,835 B1 | 3/2016 | Anderson et al. | |
| 9,385,195 B1* | 7/2016 | Zhang | H01L 29/1033 |
| 9,680,116 B2 | 6/2017 | Cao et al. | |
| 9,793,395 B1 | 10/2017 | Liu et al. | |
| 9,853,163 B2* | 12/2017 | Zhang | H01L 29/78642 |
| 9,859,166 B1 | 1/2018 | Cheng et al. | |
| 9,972,637 B2* | 5/2018 | Xiao | H01L 27/11568 |
| 10,158,022 B2* | 12/2018 | Liu | H01L 29/0649 |
| 10,431,682 B2* | 10/2019 | Liu | H01L 21/30604 |
| 2010/0155776 A1* | 6/2010 | Lee | H01L 21/82343 257/173 |
| 2016/0293697 A1* | 10/2016 | Kim | H01L 29/6656 |
| 2017/0250048 A1 | 8/2017 | Scherer et al. | |
| 2018/0097089 A1* | 4/2018 | Zang | H01L 29/785 |
| 2018/0102432 A1* | 4/2018 | Liu | H01L 29/41741 |

OTHER PUBLICATIONS

Han et al., "Vacuum nanoelectronics: Back to the future?—Gate insulated nanoscale vacuum channel transistor", Applied Physics Letters. May 21, 2012. vol. 100, Issue 21. pp. 1-5.

Park et al., "A New Slit-Type Vaccum-Channel Transistor", IEEE Transactions on Electron Devices. vol. 61, No. 12. Dec. 2014. pp. 4186-4191.

Srisonphan et al., "Metal-oxide-semiconductor field-effect transistor with a vacuum channel", Nature Nanotechnology. vol. 7, No. 8. Jul. 1, 2012. pp. 504-508.

* cited by examiner

US 10,600,606 B2

1

VERTICAL VACUUM CHANNEL TRANSISTOR WITH MINIMIZED AIR GAP BETWEEN TIP AND GATE

BACKGROUND

Technical Field

The present invention relates generally to semiconductor devices, and more specifically, to forming vertical vacuum channel transistors with minimized air gaps between tip and gate.

Description of the Related Art

In the current fabrication of an integrated circuit, a dielectric layer is formed as a device isolation structure to cover a substrate and a transistor after completion of the manufacturing of the transistor. A consequence of having multiple layers of conductive structure separated by a dielectric material, however, is the formation of a parasitic capacitor between a transistor gate and a source/drain region. The parasitic capacitance between the conductive material separated by the insulating material in microelectronic devices contributes to effects such as the resistor-capacitor (RC) delay time and a decrease of the device operating speed.

SUMMARY

In accordance with an embodiment, a method is provided for controlling an electric field from a gate structure. The method includes forming a hardmask over a fin stack including a plurality of layers, forming a first dielectric layer over the hardmask, forming a sacrificial layer over the first dielectric layer, etching the sacrificial layer to expose a top surface of the first dielectric layer, depositing a second dielectric layer in direct contact with exposed surfaces of the first dielectric layer and the sacrificial layer, removing a layer of the plurality of layers of the fin stack to define an air gap within the fin stack, and forming triangle-shaped epitaxial growths within the air gap defined within the fin stack.

In accordance with another embodiment, a method is provided for controlling an electric field from a gate structure. The method includes forming a first dielectric layer over a hardmask formed over a fin stack including alternating layers of silicon (Si) and silicon germanium (SiGe), forming a sacrificial layer over the first dielectric layer, depositing a second dielectric layer in direct contact with exposed surfaces of the first dielectric layer and the sacrificial layer, removing a SiGe layer of the fin stack to define an air gap within the fin stack, and forming triangle-shaped epitaxial growths within the air gap defined between two Si layers of the fin stack.

In accordance with yet another embodiment, a semiconductor structure is provided for controlling an electric field from a gate structure. The semiconductor structure includes a fin stack including a plurality of layers disposed between inner surfaces of a first dielectric layer, a conductive material disposed in direct contact with outer surfaces of the first dielectric layer, and an air gap defined within the fin stack with epitaxial growths disposed therein.

It should be noted that the exemplary embodiments are described with reference to different subject-matters. In particular, some embodiments are described with reference to method type claims whereas other embodiments have been described with reference to apparatus type claims. However, a person skilled in the art will gather from the

2 above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
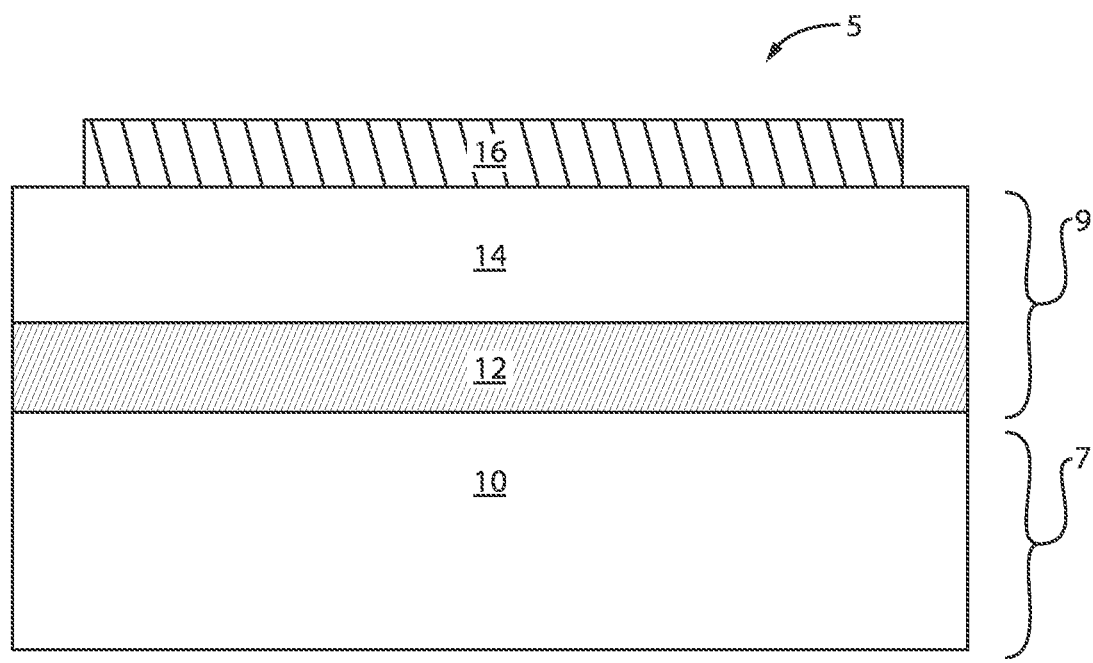
FIG. 1 is a cross-sectional view of a semiconductor structure along a fin (parallel to the fin) including a hardmask over a fin stack, in accordance with an embodiment of the present invention.

Embodiments in accordance with the present invention provide methods and devices for reducing parasitic capacitance between, e.g., gate structures and emitter/collector regions. In electrical circuits, parasitic capacitance is unwanted capacitance that exists between parts of an electronic component or circuit simply because of their proximity to each other. When two electrical conductors at different voltages are close together, the electric field between them causes electric charge to be stored thereon, which is referred to as parasitic capacitance. Therefore, reducing back-end-of-line (BEOL) interconnect parasitic capacitance remains a focus for advanced technology node development. The exemplary embodiments provide for air-gaps that can be created and incorporated into semiconductor manufacturing technology to reduce parasitic capacitance.

Embodiments in accordance with the present invention provide methods and devices for creating a vacuum transistor with a minimized air gap between tip and gate to control an electrical field from the gate. The advantages of vacuum channel devices can be achieved if the macroscale vacuum tube is miniaturized to the nanometer scale. The nano vacuum tubes can provide high frequency or power output while satisfying the metrics of lightness, cost, lifetime, and stability at harsh conditions. The vacuum is intrinsically superior to the solid as carrier transport medium since the vacuum allows ballistic transport while the carriers suffer from optical and acoustic phonon scattering in semiconductors. Moreover, vacuum channel transistors can be able to operate at terahertz frequencies.

Embodiments in accordance with the present invention provide methods and devices for forming air-gaps. The air-gaps can be formed by employing sharp epitaxial growth tips within the air gap region. The method allows for the reduction of the gap or space between the gate and the tip which can improve the efficiency of gate control for transistors. Stated differently, a vacuum transistor with minimized air gap space is created between the tip and gate to control the electrical field from the gate. This is accomplished by employing a thin dielectric and an adjustable gap mechanism between the channel and the bias gate having a double gate structure which can provide for a higher electric field. The method further allows for an integration scheme to create a vertical vacuum channel transistor compatible with 5-7 nm vertical complementary metal oxide semiconductor (CMOS) technology.

Examples of semiconductor materials that can be employed in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a cross-sectional view of a semiconductor structure along a fin (parallel to the fin) including a hardmask over a fin stack, in accordance with an embodiment of the present invention.

A semiconductor structure 5 includes a fin stack 7, 9 including a first semiconductor layer 10, a second semiconductor layer 12, and a third semiconductor layer 14. The first semiconductor layer 10 can be, e.g., a silicon (Si) layer. The second semiconductor layer 12 can be, e.g., a silicon germanium (SiGe) layer. The SiGe layer 12 can have a thickness of about 10-100 nm. The third semiconductor layer 14 can be, e.g., another silicon (Si) layer. Therefore, the fin stack 7, 9 can be formed of alternating layers of Si and SiGe. The first semiconductor layer 10 can be formed by, e.g., ion implantation, whereas the second and third semiconductor layers 12, 14 can be formed by, e.g., epitaxial growth.

Generally, epitaxial growth, deposition, formation, etc. means the growth of a semiconductor material on a deposition or seed surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor material with sufficient energy to move around on the surface and orient themselves to the crystal arrangement of the atoms of the deposition surface. Therefore, an epitaxial material has the same crystalline characteristics as the deposition surface on which it is formed. For example, an epitaxial material deposited on a <100> crystal surface will take on a <100> orientation.

Some embodiments can have more or less layers. Some embodiments can have only one layer of Si and one layer of SiGe. In some embodiments, the number of Si and SiGe layers may not be the same. For example, there can be three layers of Si and four layers of SiGe.

On top of the uppermost Si layer 14 is a hardmask layer 16. This layer can be used in photolithography. The hard mask 16 can be deposited by a deposition process including, but not limited to chemical vapor deposition (CVD), physical vapor deposition (PVD), plasma enhanced CVD, atomic layer deposition (ALD), evaporation, chemical solution deposition, or like processes.

Figure 2:
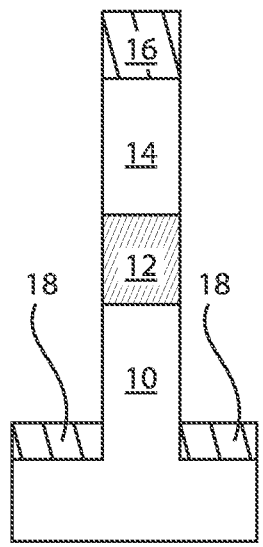
FIG. 2 is a cross-sectional view of the semiconductor structure of FIG. 1 across the fin where a spacer is formed, in accordance with an embodiment of the present invention.

FIG. 2 is a cross-sectional view of the semiconductor structure of FIG. 1 across the fin where a spacer is formed, in accordance with an embodiment of the present invention.

Spacers 18 can be formed adjacent the fin stack 7, 9. The spacers 18 can contact the first semiconductor layer 10. The spacers 18 can include an insulating material, for example, silicon dioxide, silicon nitride, SiOCN, or SiBCN. The spacer 18 material can be deposited by a deposition process, for example, CVD or PVD. The first, second, and third semiconductor layers 10, 12, 14 remain intact with flat sidewall surfaces.

Figure 3:
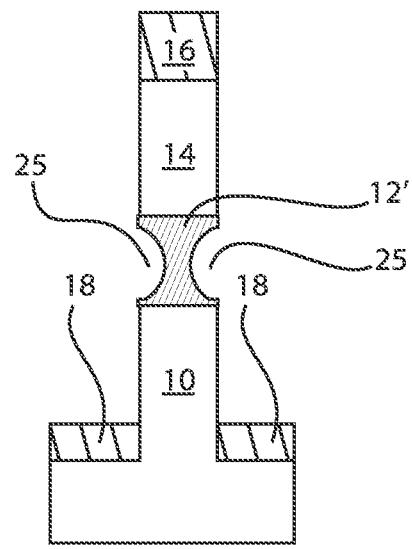
FIG. 3 is a cross-sectional view of the semiconductor structure of FIG. 1 across the fin where a spacer is formed and a selective indent is created for a layer of the fin stack, in accordance with an embodiment of the present invention.

FIG. 3 is a cross-sectional view of the semiconductor structure of FIG. 1 across the fin where a spacer is formed and a selective indent is created for a layer of the fin stack, in accordance with another embodiment of the present invention.

Spacers 18 can be formed adjacent the fin stack 7, 9. The spacers 18 can contact the first semiconductor layer 10. In this exemplary embodiment, the second semiconductor layer 12 can be recessed to form recessed semiconductor layer 12'. The recesses 25 can be referred to as indents.

The indents 25 can be substantially semi-circular. The indents 25 can help reduce the space occupied by the air gap described below.

Figure 4:
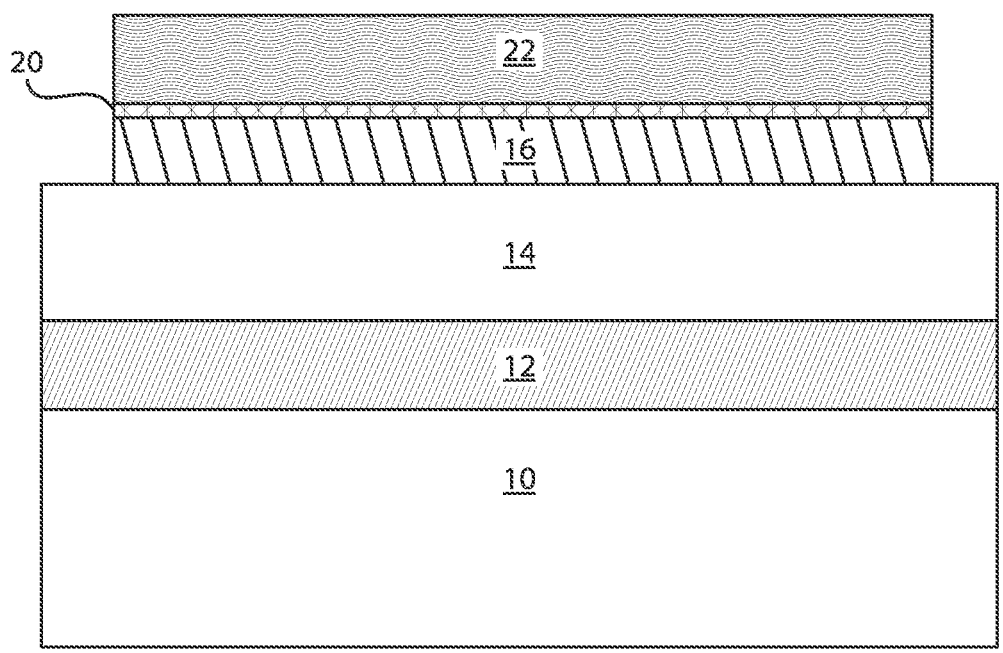
FIG. 4 is a cross-sectional view of the semiconductor structure of FIG. 1 along the fin (parallel to the fin) where a first dielectric layer and a sacrificial layer are deposited, in accordance with an embodiment of the present invention.

FIG. 4 is a cross-sectional view of the semiconductor structure of FIG. 1 along the fin (parallel to the fin) where a first dielectric layer and a sacrificial layer are deposited, in accordance with an embodiment of the present invention.

In various exemplary embodiments, a first dielectric layer 20 is deposited over the hardmask 16 and a sacrificial layer 22 is deposited over the first dielectric layer 20.

The first dielectric layer 20 can have a composition that is selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, a-C:H. Layer 20 can also be, e.g., $HfO_2$, $ZrO_2$, $Dy_2O_3$, SiON, $Al_2O_3$, and a high-k dielectric.

In some embodiments, the first dielectric layer 20 includes multiple materials. The first dielectric layer 20 can be formed by any suitable processing technique, including but not limited to, thermal oxidation, chemical oxidation, thermal nitridation, plasma oxidation, plasma nitridation, atomic layer deposition (ALD), molecular layer deposition (MLD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), in-situ radical assisted deposition, high temperature oxide deposition (HTO), low temperature oxide deposition (LTO), ozone/TEOS deposition, limited reaction processing CVD (LRPCVD), ultrahigh vacuum chemical vapor deposition (UHVCVD), metalorganic chemical vapor deposition (MOCVD), physical vapor deposition (PVD), sputtering, plating, evaporation, spin-on-coating, ion beam deposition, electron beam deposition, laser assisted deposition, chemical solution deposition, or any combination of those methods.

Figure 5:
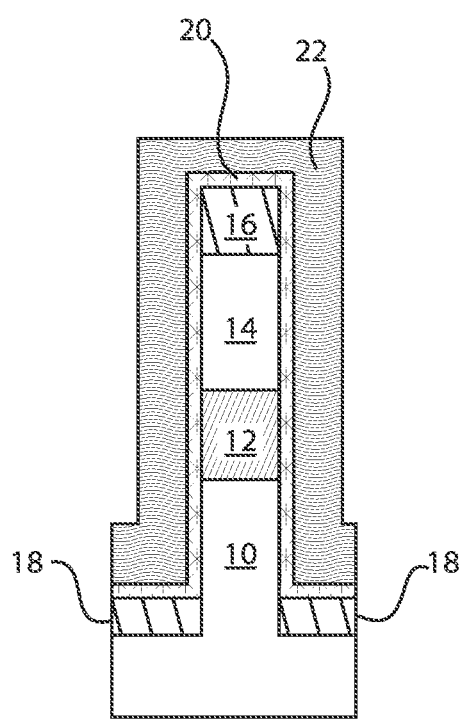
FIG. 5 is a cross-sectional view of the semiconductor structure of FIG. 4 across the fin depicting the first dielectric layer and the sacrificial layer over the fin stack, in accordance with an embodiment of the present invention.

FIG. 5 is a cross-sectional view of the semiconductor structure of FIG. 4 across the fin depicting the first dielectric layer and the sacrificial layer over the fin stack, in accordance with an embodiment of the present invention.

In various exemplary embodiments, the first dielectric layer 20 is shown covering or encapsulating the fin stack 7, 9. The first dielectric layer 20 contacts all three semiconductor layers 10, 12, 14, as well as the spacers 18. The sacrificial layer 22 is shown being formed over the first dielectric layer 20. The sacrificial layer 22 can be formed by any suitable processing technique, including but not limited to, thermal oxidation, chemical oxidation, thermal nitridation, plasma oxidation, plasma nitridation, atomic layer deposition (ALD), molecular layer deposition (MLD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), in-situ radical assisted deposition, high temperature oxide deposition (HTO), low temperature oxide deposition (LTO), ozone/TEOS deposition, limited reaction processing CVD (LRPCVD), ultrahigh vacuum chemical vapor deposition (UHVCVD), metalorganic chemical vapor deposition (MOCVD), physical vapor deposition (PVD), sputtering, plating, evaporation, spin-on-coating, ion beam deposition, electron beam deposition, laser assisted deposition, chemical solution deposition, or any combination of those methods.

Figure 6:
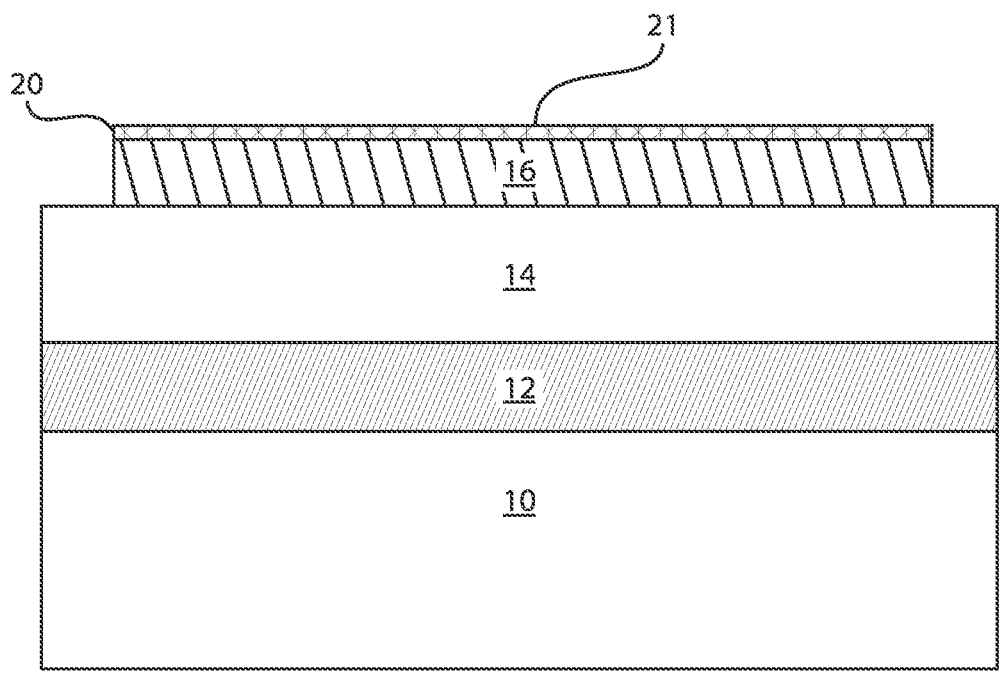
FIG. 6 is a cross-sectional view of the semiconductor structure of FIG. 4 along the fin (parallel to the fin) where the sacrificial layer is etched to expose a top surface of the first dielectric layer, in accordance with an embodiment of the present invention.

FIG. 6 is a cross-sectional view of the semiconductor structure of FIG. 4 along the fin (parallel to the fin) where the sacrificial layer is etched to expose a top surface of the first dielectric layer, in accordance with an embodiment of the present invention.

In various exemplary embodiments, directional etching is performed to remove portions of the sacrificial layer 22. Thus, a top surface 21 of the first dielectric layer 20 is exposed.

The directional etch is an anisotropic etch process. An anisotropic etch process is a material removal process in which the etch rate in the direction normal to the surface to be etched is greater than in the direction parallel to the surface to be etched. Non-limiting examples of anisotropic etching processes include ion beam etching, plasma etching, laser ablation, or any combination thereof.

Figure 7:
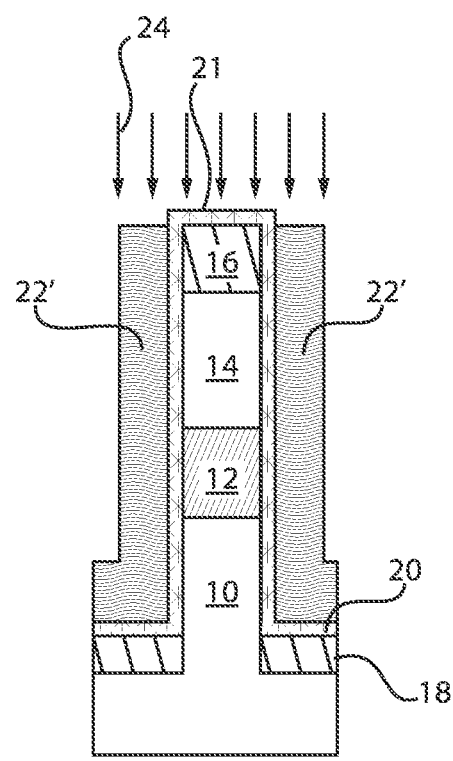
FIG. 7 is a cross-sectional view of the semiconductor structure of FIG. 6 across the fin where the sacrificial layer is etched to expose the top surface of the first dielectric layer, in accordance with an embodiment of the present invention.

FIG. 7 is a cross-sectional view of the semiconductor structure of FIG. 6 across the fin where the sacrificial layer is etched to expose the top surface of the first dielectric layer, in accordance with an embodiment of the present invention.

In various exemplary embodiments, directional etching by, e.g., RIE 24 results in exposure of the top surface 21 of the first dielectric layer 20. Portions 22' of the sacrificial layer 22 remain adjacent the fin stack 7, 9.

Figure 8:
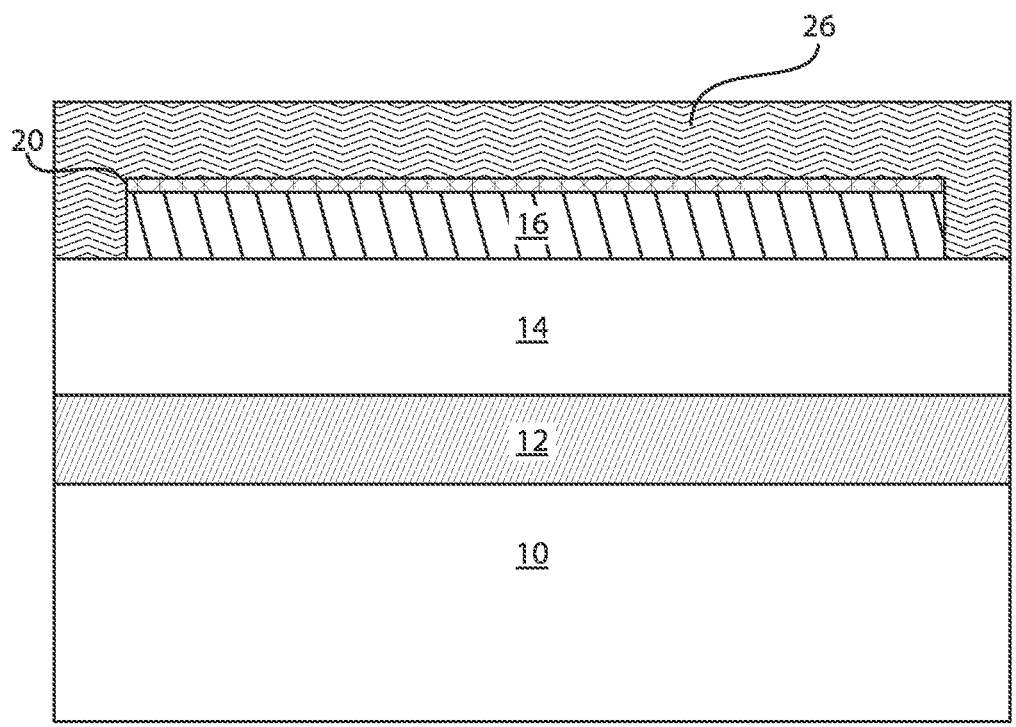
FIG. 8 is a cross-sectional view of the semiconductor structure of FIG. 6 along the fin (parallel to the fin) where a second dielectric layer is deposited, in accordance with an embodiment of the present invention.

FIG. 8 is a cross-sectional view of the semiconductor structure of FIG. 6 along the fin (parallel to the fin) where a second dielectric layer is deposited, in accordance with an embodiment of the present invention.

In various exemplary embodiments, a second dielectric layer 26 is deposited over the first dielectric layer 20. The second dielectric layer 26 can be, e.g., an oxide layer. The oxide layer 26 completely encompasses the remaining sacrificial layer 22' in FIG. 7.

Non-limiting examples of oxides for the oxide layer 26 include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an ALD process, or any combination thereof.

Figure 9:
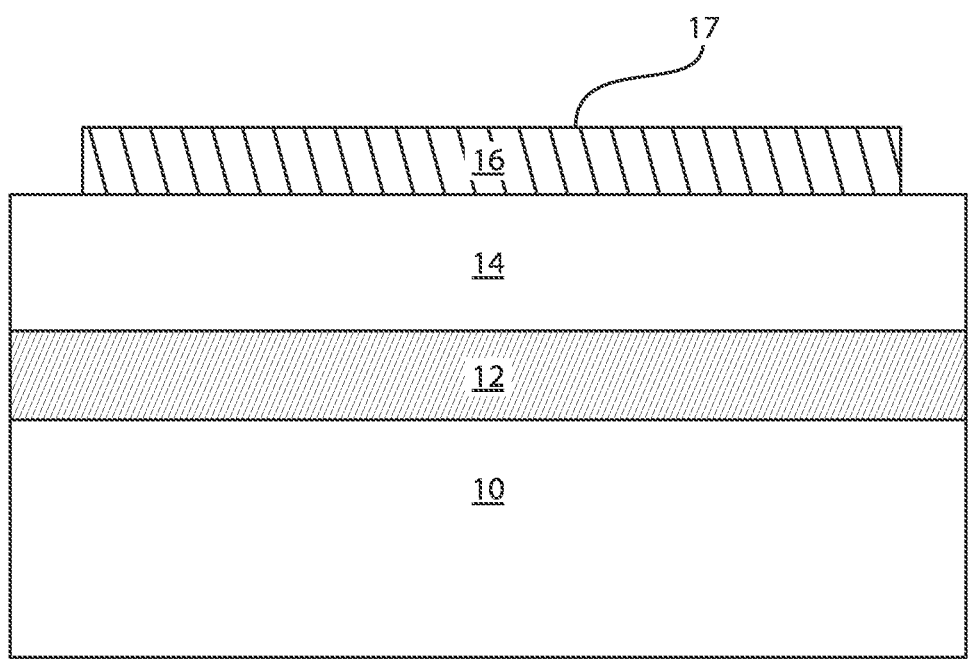
FIG. 9 is a cross-sectional view of the semiconductor structure of FIG. 8 along the fin (parallel to the fin) where the second dielectric layer is etched away, in accordance with an embodiment of the present invention.

FIG. 9 is a cross-sectional view of the semiconductor structure of FIG. 8 along the fin (parallel to the fin) where the second dielectric layer is etched away, in accordance with an embodiment of the present invention.

In various exemplary embodiments, the oxide layer 26 is planarized such that a top surface 17 of the hardmask 16 is exposed. The oxide layer 26, however, remains on sidewalls of the remaining sacrificial layer 22' in FIG. 7. The oxide layer 26 can be removed by etching, for example, using a buffered hydrofluoric acid (HF) solution to remove the oxide layer.

Figure 10:
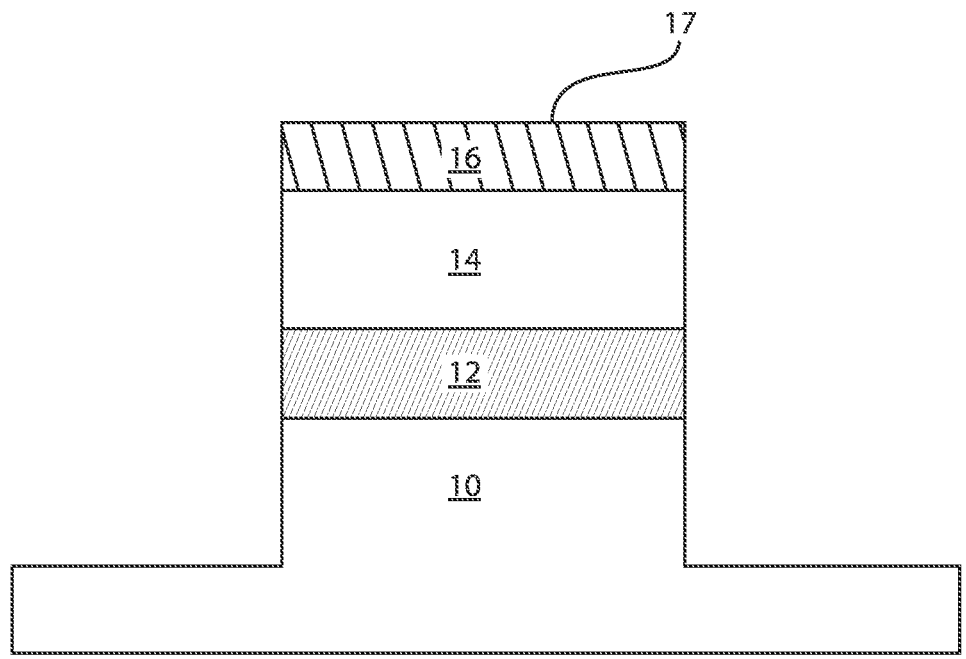
FIG. 10 is a cross-sectional view of the semiconductor structure of FIG. 9 along the fin (parallel to the fin) where the fin is cut, in accordance with an embodiment of the present invention.

FIG. 10 is a cross-sectional view of the semiconductor structure of FIG. 9 along the fin (parallel to the fin) where the fin is cut, in accordance with an embodiment of the present invention.

In various exemplary embodiments, the fin is cut to create the desired fin size.

Figure 11:
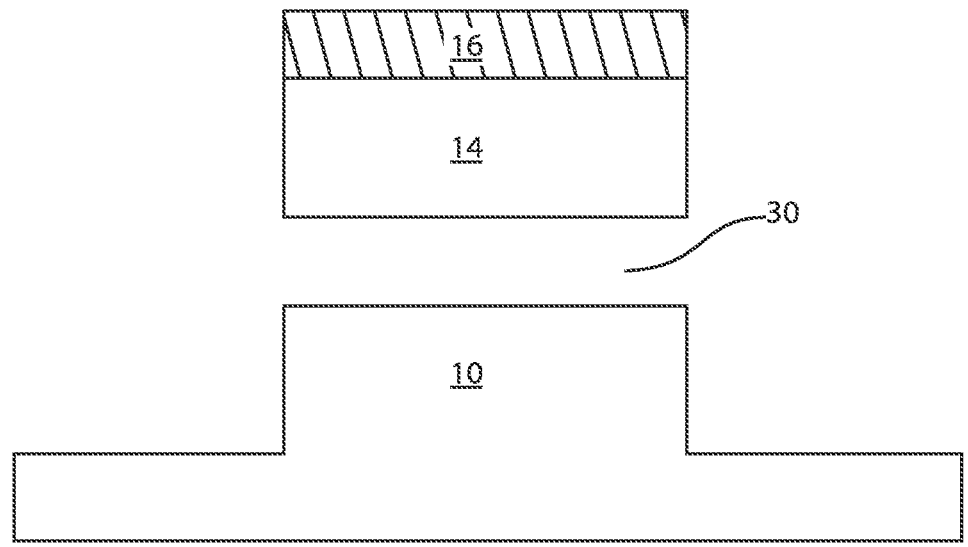
FIG. 11 is a cross-sectional view of the semiconductor structure of FIG. 10 along the fin (parallel to the fin) where a middle layer of the substrate stack is selectively etched, in accordance with an embodiment of the present invention.

FIG. 11 is a cross-sectional view of the semiconductor structure of FIG. 10 along the fin (parallel to the fin) where a middle layer of the substrate stack is selectively etched, in accordance with an embodiment of the present invention.

In various exemplary embodiments, the second semiconductor layer 12 is selectively etched such that opening or cavity or airgap 30 is formed. The etching can be performed by, e.g., wet etch techniques. The selective etching results in complete removal of the SiGe layer 12 (FIG. 2) or the SiGe layer 12' (FIG. 3). The selective wet etch process can include, for example, buffered hydrofluoric acid (BHF), hydrofluoric acid (HF), hydrofluoric nitric acid (HNA), phosphoric acid, HF diluted by ethylene glycol (HFEG), hydrochloric acid (HCl), or any combination thereof.

Figure 12:
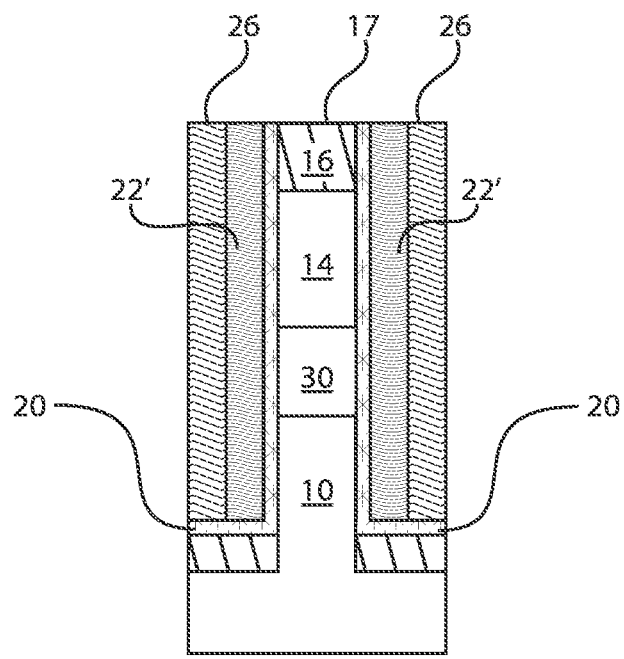
FIG. 12 is a cross-sectional view of the semiconductor structure of FIG. 11 across the fin depicting a cavity formed within the fin stack when the middle layer of the fin stack is selectively removed, in accordance with an embodiment of the present invention.

FIG. 12 is a cross-sectional view of the semiconductor structure of FIG. 11 across the fin depicting a cavity formed within the fin stack when the middle layer of the fin stack is selectively removed, in accordance with an embodiment of the present invention.

In various exemplary embodiments, the second semiconductor layer 12 is selectively etched such that opening or cavity or air gap 30 is formed between the first and third semiconductor layers 10, 14. The air gap 30 can be substantially rectangular for the configuration shown in FIG. 2 and the air gap 30 can have a substantially hour-glass shape for the configuration in FIG. 3. The selective etching of the second semiconductor layer 12 does not affect the remaining sacrificial layer 22' and the oxide layer 26. The selective etching results in complete removal of the SiGe layer 12 (FIG. 2) or the SiGe layer 12' (FIG. 3).

Figure 13:
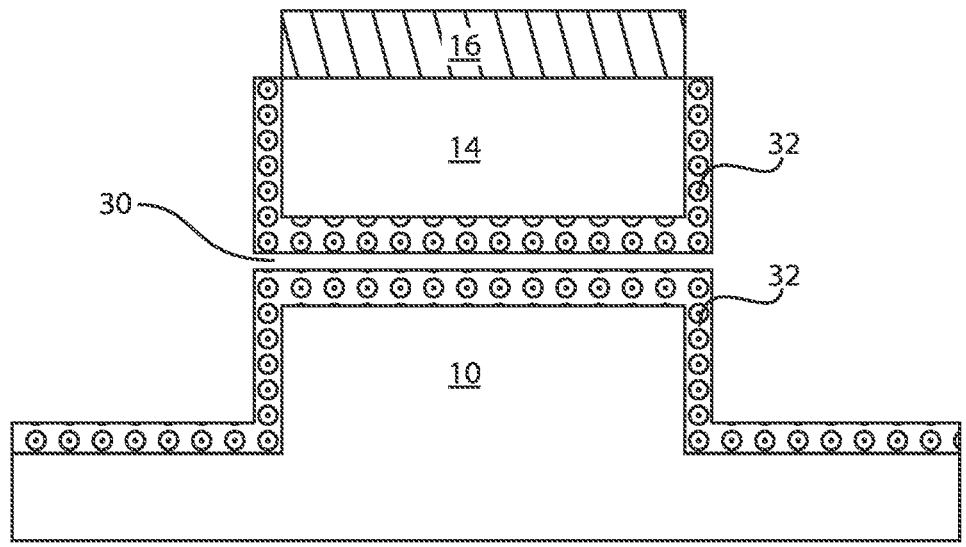
FIG. 13 is a cross-sectional view of the semiconductor structure of FIG. 11 along the fin (parallel to the fin) where an epitaxial growth takes place, in accordance with an embodiment of the present invention.

FIG. 13 is a cross-sectional view of the semiconductor structure of FIG. 11 along the fin (parallel to the fin) where an epitaxial growth takes place, in accordance with an embodiment of the present invention.

In various exemplary embodiments, epitaxial growth 32 occurs adjacent the fin stack and within the air gap 30. The epitaxial growths 32 occupy a substantial space between the first and third semiconductor layers 10, 14 such that the air gap is minimized between the tips of the epitaxial growths and the gate of a transistor. By minimizing the air gap space, the electric field from the gate can be better controlled with more accuracy. The epitaxial growths 32 can be SiGe epi tips. Therefore, the air gap 30 can be manipulated or adjusted or altered or fine-tuned or tailored or modified by inserting or depositing or creating various epitaxial growths 32 having various geometrical configurations to minimize the space occupied by the air gaps 30. The minimization of the space created by the air gap 30 aids in the control of an electric field from the gate of a transistor.

Figure 14:
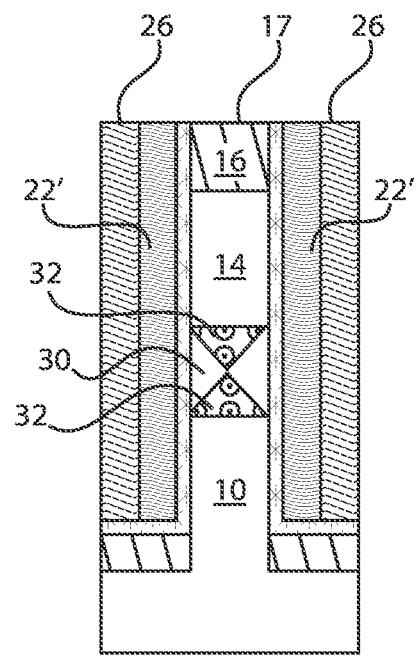
FIG. 14 is a cross-sectional view of the semiconductor structure of FIG. 13 across the fin where the epitaxial growth takes place in the cavity formed by removing the middle layer of the fin stack, in accordance with an embodiment of the present invention.

FIG. 14 is a cross-sectional view of the semiconductor structure of FIG. 13 across the fin where the epitaxial growth takes place in the cavity formed by removing the middle layer of the fin stack, in accordance with an embodiment of the present invention.

In various exemplary embodiments, the epitaxial growth 32 is shown within the opening or air gap 30. The epitaxial growth 32 can have a triangular shape. In particular, two triangular configurations can be formed within the air gap 30. The tips of the two triangular configurations can point toward each other. In other words, the triangular configuration is formed tip-to-tip. The two triangular configurations do not contact each other.

Figure 15:
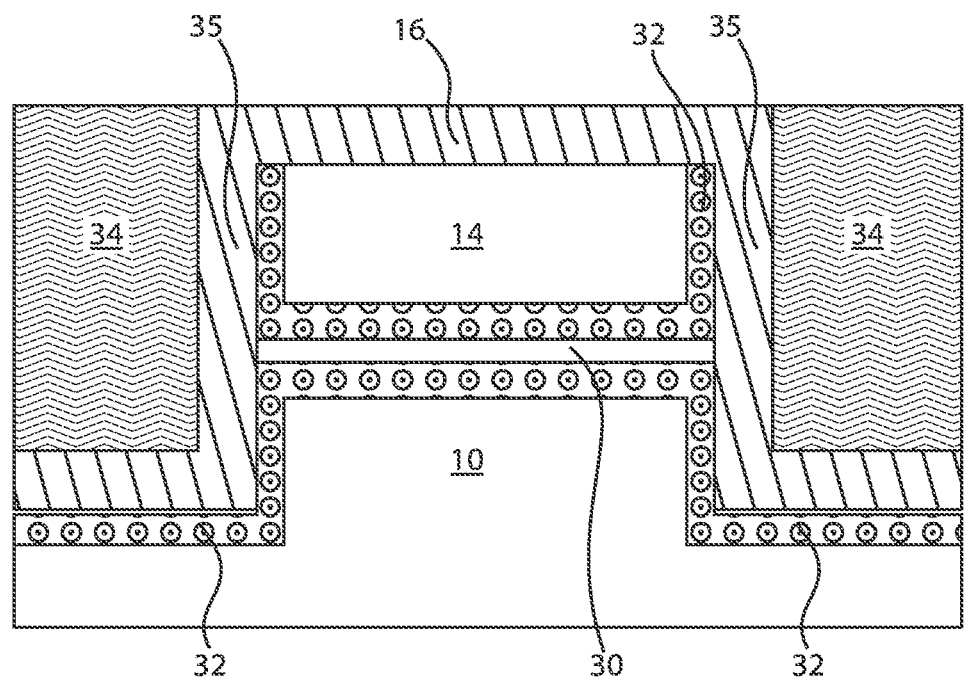
FIG. 15 is a cross-sectional view of the semiconductor structure of FIG. 13 along the fin (parallel to the fin) where sidewall spacers are formed and an shallow trench isolation (STI) oxide is deposited, in accordance with an embodiment of the present invention.

FIG. 15 is a cross-sectional view of the semiconductor structure of FIG. 13 along the fin (parallel to the fin) where sidewall spacers are formed and an shallow trench isolation (STI) oxide is deposited, in accordance with an embodiment of the present invention.

In various exemplary embodiments, sidewalls spacers 35 are formed adjacent the epitaxial growth 32. Additionally, an STI oxide layer 34 is formed adjacent the sidewalls spacers 35.

The isolation regions 34 separate individual transistor devices that are formed on the same substrate. The isolation regions can be shallow trench isolation (STI) regions. Other non-limiting examples of suitable dielectric materials for the isolation regions 34 include tetraethylorthosilicate (TEOS) oxide, high aspect ratio plasma (HARP) oxide, silicon oxide, high temperature oxide (HTO), high density plasma (HDP) oxide, oxides formed by an ALD process, silicon nitride, silicon oxynitride, or any combination thereof.

Figure 16:
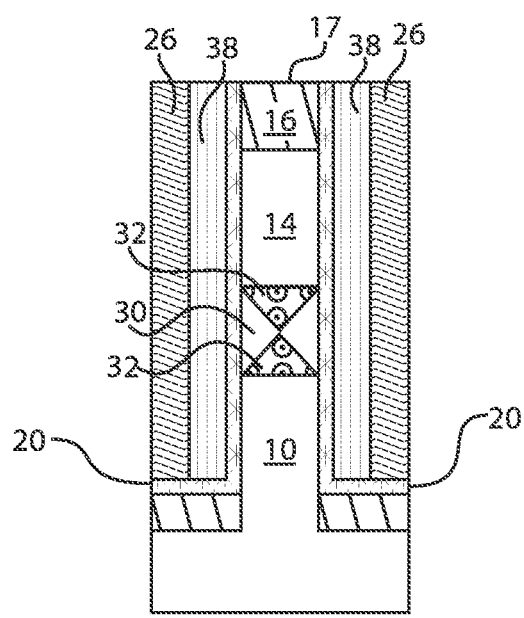
FIG. 16 is a cross-sectional view of the semiconductor structure of FIG. 15 across the fin depicting the STI oxide deposition adjacent the sacrificial layer, in accordance with an embodiment of the present invention.

FIG. 16 is a cross-sectional view of the semiconductor structure of FIG. 15 across the fin depicting the STI oxide deposition adjacent the sacrificial layer, in accordance with an embodiment of the present invention.

In various exemplary embodiments, the remaining sacrificial layer 22' is removed and a metal fill 38 takes place. The metal fill 38 is directly between the first dielectric layer 20 and the oxide layer 26. The metal fill 38 can be planarized by, e.g., CMP, such that the top surface of the metal fill 38 is flush with the top surface 17 of the hardmask 16. The metal fill 38 does not affect the epitaxial growth 32 within the cavity or air gap 30.

The metal fill 38 can be, e.g., tungsten (W) or cobalt (Co) with silicide metal liner such as titanium (Ti) and titanium nitride (TiN). The conductive metal 38 can be deposited by a suitable deposition process, for example, CVD, PECVD, PVD, plating, thermal or e-beam evaporation, and sputtering. A planarization process, for example, CMP, is performed to polish the surface of the conductive gate metal material 38.

Figure 17:
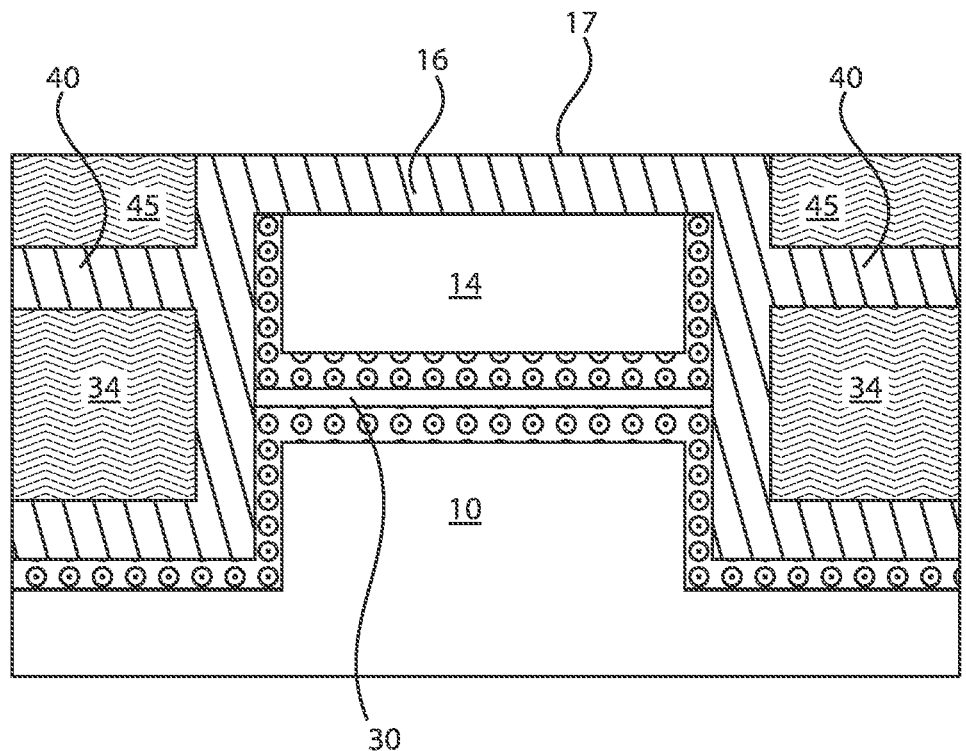
FIG. 17 is a cross-sectional view of the semiconductor structure of FIG. 15 along the fin (parallel to the fin) where a metal fill takes place, the metal fill is recessed, and dielectrics are subsequently deposited, in accordance with an embodiment of the present invention.

FIG. 17 is a cross-sectional view of the semiconductor structure of FIG. 15 along the fin (parallel to the fin) where a metal fill takes place, the metal fill is recessed, and dielectrics are subsequently deposited, in accordance with an embodiment of the present invention.

In various exemplary embodiments, the metal fill 38 is recessed and a nitride-based dielectric 40 is deposited. Then an oxide-based dielectric 45 is deposited over the nitride-based dielectric 40. The oxide-based dielectric 45 can be planarized by, e.g., CMP such that a top surface of the oxide-based dielectric 45 is flush with a top surface 17 of the hardmask 16.

Non-limiting examples of insulating layers 40 include silicon nitride, silicon oxide, silicon dioxide, aluminum oxide, or a combination thereof. In an exemplary embodiment, the oxide layer 26 is an ALD oxide, and the insulating layer 40 is silicon nitride (SiN).

Figure 18:
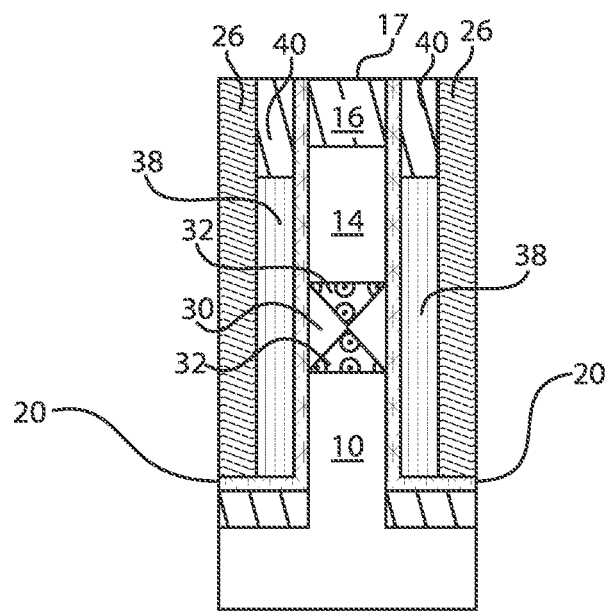
FIG. 18 is a cross-sectional view of the semiconductor structure of FIG. 17 across the fin where the metal fill is recessed and dielectrics are subsequently deposited, in accordance with an embodiment of the present invention.

FIG. 18 is a cross-sectional view of the semiconductor structure of FIG. 17 across the fin where the metal fill is recessed and dielectrics are subsequently deposited, in accordance with an embodiment of the present invention.

In various exemplary embodiments, the metal fill 38 is recessed and a nitride-based dielectric 40 is deposited. The oxide-based dielectric 45 can be planarized by, e.g., CMP such that a top surface of the oxide-based dielectric 45 is flush with a top surface 17 of the hardmask 16. The nitride-based dielectric 40 and the oxide-based dielectric 45 do not affect the epitaxial growth 32 within the cavity or air gap 30.

Figure 19:
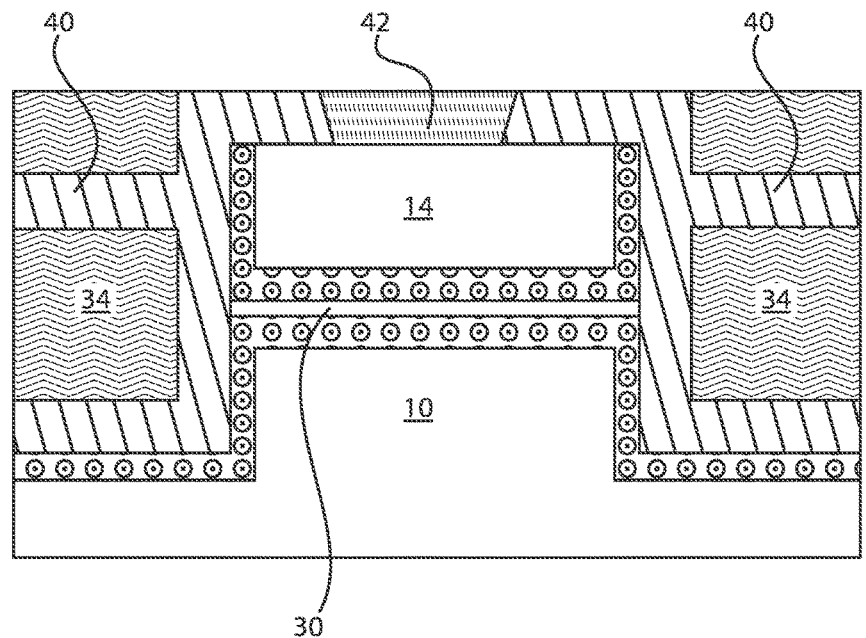
FIG. 19 is a cross-sectional view of the semiconductor structure of FIG. 17 along the fin (parallel to the fin) where contacts are formed, in accordance with an embodiment of the present invention.

FIG. 19 is a cross-sectional view of the semiconductor structure of FIG. 17 along the fin (parallel to the fin) where contacts are formed, in accordance with an embodiment of the present invention.

In various exemplary embodiments, contacts 42 are formed. A gate contact, a drain contact (or emitter contact), and a source contact (or collector contact) can be formed.

The gate, emitter, and collector contact trenches can be filled with a conductive material or a combination of conductive materials. The conductive material can be a conductive metal, for example, aluminum (Al), platinum (Pt), gold (Au), tungsten (W), titanium (Ti), or any combination thereof. The conductive material can be deposited by a suitable deposition process, for example, CVD, PECVD, PVD, plating, thermal or e-beam evaporation, or sputtering.

Figure 20:
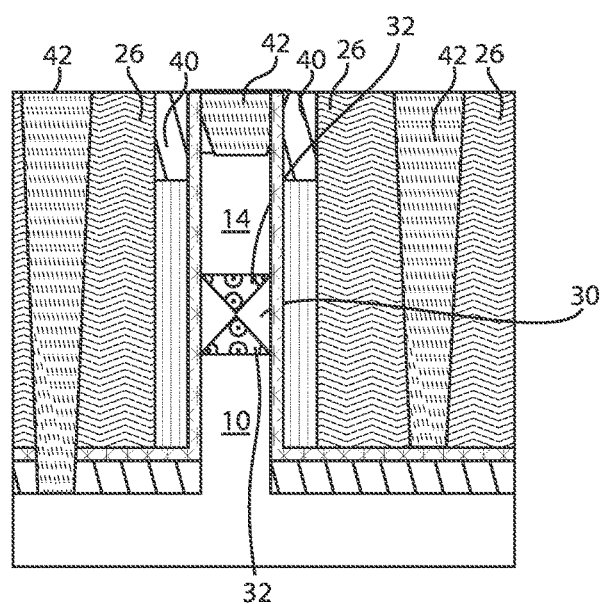
FIG. 20 is a cross-sectional view of the semiconductor structure of FIG. 19 across the fin depicting formation of the contacts, in accordance with an embodiment of the present invention.

FIG. 20 is a cross-sectional view of the semiconductor structure of FIG. 19 across the fin depicting formation of the contacts, in accordance with an embodiment of the present invention.

In various exemplary embodiments, contacts 42 are formed.

Therefore, according to FIGS. 13-20, the air gaps 30 can be formed within the confines of the epitaxial growth 32. Stated differently, the air gaps 30 can be confined within the first dielectric layer 20. The air-gaps 30 can have an irregular-shaped configuration. The formation of the air-gap 30 reduces the parasitic capacitance between gate, collector, and emitter regions of transistors. The air gaps between the tips and the gate can aid in the control of electric fields from the gate. Thus, the air-gap 30 can be incorporated into different types of semiconductor devices, such as, but not limited to, fin field-effect-transistors (FinFETs), gate-all-around devices, etc.

It is noted that the selection of these dielectric materials and processes has an impact in the voids (air gaps 30)

dimension and volume. The overall void dimension and type of dielectric material are related to the total device capacitance reduction and reliability. Significant capacitance reduction with good reliability can be achieved on current 5-7 nm device structures through material, process, and structural/architectural optimization with air gaps incorporating sharp epi tip process approaches described herein.

In conclusion, continued integrated circuit scaling deeper into the nanoscale regime has provided improved performance through shrinking of the Front-End-of-Line (FEOL) device and Back-End-of-Line (BEOL) interconnect. With scaling, resistance-capacitance (RC) delay is an increasing challenge, limiting overall product performance. Capacitance reduction is therefore important for device performance in both the FEOL and BEOL device structure. Conventional capacitance reduction methods for FEOL and BEOL while maintaining yield and reliability have needed significant material innovations such lower-k cap and bulk dielectrics with desired mechanical, structural, electrical and other properties. To further improve capacitance, other innovations in device structure and process integration are needed, such as air gaps and air spacers described in accordance with the exemplary embodiments of the present invention. The air spacer and air gap structures can be employed in vacuum channel transistors to optimize the capacitance reduction while maintaining yield and reliability.

Vacuum channel transistors are advantageous for several reasons. Compared to other semiconductor transistors, vacuum channel transistors can function at speeds that are many orders of magnitude faster. Vacuum channel transistors can also operate at higher frequencies, for example, terahertz frequencies, which can be beyond the reach of solid-state devices. While electrons in a solid state transistor suffer from collisions with atoms, which is also called crystal-lattice scattering, electrons freely propagate in the open channel space of a vacuum transistor. Additionally, vacuums are not susceptible to radiation damage that can damage semiconductors. Vacuums also produce less noise and distortion than solid-state materials.

Regarding FIGS. 1-18, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Non-limiting examples of dielectrics include silicon nitride, SiOCN, SiBCN, or a combination thereof. One directional deposition method that can be used to deposit silicon nitride, for example, is gas cluster ion beam (GCIB) deposition.

Non-limiting examples of oxides include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for reducing parasitic capacitance by employing air gaps with sharp tip epi growths therein (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor structure for controlling an electric field from a gate structure, the semiconductor structure comprising:
    a fin stack including a plurality of layers disposed between inner surfaces of a first dielectric layer;
    a conductive material disposed in direct contact with outer surfaces of the first dielectric layer; and
    an air gap defined within the fin stack with epitaxial growths disposed therein.

2. The semiconductor structure of claim 1, wherein a second dielectric layer directly contacts outer surfaces of the conductive material.

3. The semiconductor structure of claim 1, wherein a portion of the first dielectric layer is formed in direct contact with spacers.

4. The semiconductor structure of claim 1, wherein the epitaxial growths are triangle-shaped epitaxial growths created in a tip-to-tip configuration.

5. The semiconductor structure of claim 1, wherein a nitride-based dielectric is disposed over the conductive material.

6. The semiconductor structure of claim 1, wherein gate, emitter, and collector contacts are formed.

7. The semiconductor structure of claim 1, wherein the epitaxial growths directly contact the fin stacks.

8. The semiconductor structure of claim 1, wherein the epitaxial growths minimize a space defined by the air gap.

9. The semiconductor structure of claim 8, wherein minimizing the space defined by the air gap allows for the controlling of the electric field from the gate structure of a transistor.

10. The semiconductor structure of claim 1, wherein the epitaxial growths are formed from silicon germanium (SiGe).

11. The semiconductor structure of claim 1, wherein the epitaxial growths are prevented from contacting each other within the air gap.

12. A semiconductor structure, comprising:
    a fin stack including a plurality of layers disposed between inner surfaces of a first dielectric layer;
    a conductive material disposed in direct contact with outer surfaces of the first dielectric layer; and
    an air gap defined within the fin stack, the air gap accommodating triangle-shaped epitaxial growths created in a tip-to-tip configuration.

13. The semiconductor structure of claim 12, wherein a second dielectric layer directly contacts outer surfaces of the conductive material.

14. The semiconductor structure of claim 12, wherein a portion of the first dielectric layer is formed in direct contact with spacers.

15. The semiconductor structure of claim 12, wherein a nitride-based dielectric is disposed over the conductive material.

16. The semiconductor structure of claim 12, wherein gate, emitter, and collector contacts are formed.

17. The semiconductor structure of claim 12, wherein the triangle-shaped epitaxial growths directly contact the fin stacks.

18. The semiconductor structure of claim 12, wherein the triangle-shaped epitaxial growths minimize a space defined by the air gap.

19. The semiconductor structure of claim 18, wherein minimizing the space defined by the air gap allows for the controlling of the electric field from the gate structure of a transistor.

20. The semiconductor structure of claim 12, wherein the triangle-shaped epitaxial growths are formed from silicon germanium (SiGe).

* * * * *